US008315411B2

(12) United States Patent
Hanna et al.

(10) Patent No.: US 8,315,411 B2
(45) Date of Patent: Nov. 20, 2012

(54) DYNAMIC VOLUME CONTROL AND MULTI-SPATIAL PROCESSING PROTECTION

(75) Inventors: Christopher M. Hanna, Arlington, MA (US); Gregory Benulis, Boxford, MA (US)

(73) Assignee: THAT Corporation, Milford, MA (US)

(*) Notice: Subject to any disclaimer, the term of this patent is extended or adjusted under 35 U.S.C. 154(b) by 125 days.

(21) Appl. No.: 12/619,655

(22) Filed: Nov. 16, 2009

(65) Prior Publication Data

US 2010/0128904 A1    May 27, 2010

Related U.S. Application Data

(60) Provisional application No. 61/114,777, filed on Nov. 14, 2008, provisional application No. 61/114,684, filed on Nov. 14, 2008.

(51) Int. Cl.
*H03G 3/00* (2006.01)
*H03G 7/00* (2006.01)
*H04B 15/00* (2006.01)

(52) U.S. Cl. ........ 381/107; 381/108; 381/106; 381/94.5

(58) Field of Classification Search .................... 381/28, 381/104–108, 94.5
See application file for complete search history.

(56) References Cited

U.S. PATENT DOCUMENTS 4,249,042 A    2/1981    Orban
(Continued)

FOREIGN PATENT DOCUMENTS

EP    0606968    7/1994
(Continued)

OTHER PUBLICATIONS

International Search Report and Written Opinion of the International Searching Authority (European Patent Office), dated Mar. 1, 2010, for PCT Application No. PCT/US2009/064654 (published as WO2010/057134A1), filed Nov. 16, 2009.
(Continued)

*Primary Examiner* — Devona Faulk
*Assistant Examiner* — George Monikang
(74) *Attorney, Agent, or Firm* — McDermott Will & Emery LLP

(57) ABSTRACT

A disclosed system and method dynamically controls the perceived volume of a stereo audio program including left and right channel signals. The system comprises: a dynamic volume control configured and arranged so as to maintain a perceived constant volume level of the stereo audio program; and an excessive spatial processing protection processor configured and arranged for controlling the level of a difference signal, created as a function of the right channel signal subtracted from the left channel signal (L–R), relative to the level of a sum signal, created as a function of the right channel signal plus the left channel signal; wherein the excessive spatial processing protection processor processes the audio signals so as to control the difference (L–R) signal relative to the sum (L+R) signal. A system and method are also provided for dynamically controlling the perceived volume of a stereo audio program including left and right channel signals, comprising: a dynamic volume control configured and arranged so as to maintain a perceived constant volume level of the stereo audio program; and a program change detector configured and arranged to provide a program change signal indicating that the volume of the left and right channel signals has dropped below a threshold level for at least a threshold time period so as to anticipate a possible change in the sound level of the left and right channel signals; wherein the dynamic volume control is responsive to the program change signal.

7 Claims, 7 Drawing Sheets

U.S. PATENT DOCUMENTS

| | | | |
|---|---|---|---|
| 4,412,100 | A | 10/1983 | Orban |
| 4,460,871 | A | 7/1984 | Orban |
| 4,837,824 | A | 6/1989 | Orban |
| 4,866,774 | A | 9/1989 | Klayman |
| 4,910,778 | A | 3/1990 | Barton |
| 5,050,217 | A | 9/1991 | Orban |
| 5,054,071 | A | 10/1991 | Bacon |
| 5,127,059 | A * | 6/1992 | Elion et al. .................. 381/120 |
| 5,165,099 | A | 11/1992 | Onaya et al. |
| 5,412,731 | A | 5/1995 | Desper |
| 5,737,434 | A | 4/1998 | Orban |
| 5,778,077 | A | 7/1998 | Davidson |
| 5,784,468 | A | 7/1998 | Klayman |
| 5,896,456 | A | 4/1999 | Desper |
| 6,285,767 | B1 | 9/2001 | Klayman |
| 6,552,753 | B1 | 4/2003 | Zhurbinskiy et al. |
| 6,859,238 | B2 | 2/2005 | Wu |
| 6,993,480 | B1 | 1/2006 | Klayman |
| 7,031,474 | B1 | 4/2006 | Yuen et al. |
| 7,110,558 | B1 | 9/2006 | Elliott |
| 7,251,337 | B2 | 7/2007 | Jacobs |
| 2006/0008096 | A1 | 1/2006 | Waller |
| 2006/0256980 | A1* | 11/2006 | Pritchard .................. 381/104 |
| 2007/0003075 | A1 | 1/2007 | Cooper et al. |
| 2007/0092089 | A1 | 4/2007 | Seefeldt et al. |
| 2007/0291959 | A1 | 12/2007 | Seefeldt |
| 2008/0253586 | A1 | 10/2008 | Wei |
| 2008/0273719 | A1 | 11/2008 | Chen |

FOREIGN PATENT DOCUMENTS

| | | |
|---|---|---|
| JP | 11122060 | 4/1999 |
| WO | 2007085267 A2 | 8/2007 |
| WO | 2007085267 A3 | 8/2007 |
| WO | 2010057133 A1 | 5/2010 |
| WO | 2010057134 A1 | 5/2010 |

OTHER PUBLICATIONS

International Search Report and Written Opinion of the International Searching Authority (European Patent Office), dated Mar. 1, 2010, for PCT Application No. PCT/US2009/064653 (published as WO2010/057133A1), filed Nov. 16, 2009.

Archibald, F.J. 2008. Software Implementation of Automatic Gain Controller for Speech Signal. Texas Instruments White Paper, SPRAAL1, Jul. 2008, 15 pages.

Bauer, B.B. et al. 1967. A Loudness-Level Monitor for Broadcasting. IEEE Transactions on Audio and Electroacoustics, vol. AE-15, No. 4, Dec. 1967, pp. 177-182.

Bogh Brixen, Eddy. 2007. Audio Levels and Readings. DK-Technologies Supplemental Publication provided with Manual for Audio Meter. DK-Technologies A/S, Herlev, Denmark. 15 pages.

DK-Technologies. 2007. Stereo Loudness Meter, MSD100C-Loudness.Technical Data Sheet for MSD100C-Loudness Meter, dated Nov. 15, 2007, 4 pages.

Dolby. 2004. LM100 Broadcast Loudness Meter Technical Data Sheet. Dolby Laboratories, Inc., San Francisco, CA. 2 pages.

Giles, M. (ed.) 1976. Audio/Radio Handbook (D. Bohn), Section 5.2.4. (National Semiconductor Corporation, Santa Clara, California).

ITU (International Telecommunication Union). 2006-2007. Recommendation ITU-R BS.1770-1, Algorithms to Measure Audio Programme Loudness and True-Peak Audio Level (Question ITU-R 2/6). 19 pages.

Jones, B.L. et al. 1981. A New Loudness Indicator for Use in Broadcasting. Originally published in the JSMPTE, Sep. 1981, Presented at the 71st Convention of the Audio Engineering Society, Mar. 2-5, 1982, Montreux.

Lund, T. 2006. Control of Loudness in Digital TV. in NAB BEC Proceedings, 2006, pp. 57-65.

Lund, T. 2006. Stop Counting Samples. Presentation delivered to the 121st Audio Engineering Society Meeting, San Francisco, Oct. 8, 2006. 73 pages.

Moore, B.C.J. et al. 2003. Why Are Commercials So Loud?—Perception and Modeling of the Loudness of Amplitude-Compressed Speech. Journal of the Audio Engineering Society, vol. 51, No. 12, Dec. 2003, pp. 1123-1132.

Optimum Technologies / ORBAN CRL Systems. Date Unknown. Automatic Loudness Control in Television Broadcast: Current Practice. Presentation by ORBAN CRL Systems, available online at http://www.orban.com/support/orban/techtopics/Automatic%20Loudness%20Control%20in%20Sound%20for%20Picture.pdf.

Skovenborg, E. et al. 2004. Evaluation of Different Loudness Models with Music and Speech Material. Paper presented to the 117th Convention of the Audio Engineering Society, Oct. 28-31, 2004, San Francisco, CA, 34 pages.

THAT Corporation. 1999. Improving Loudspeaker Signal Handling Capability. Design Note 04 (formerly Application Note 104). THAT Corporation, Milford, Massachusetts, 7 pages.

THAT Corporation. 2000-2010. High Performance Stereo AGC Based on the THAT 4301. Design Note 118. THAT Corporation, Milford, Massachusetts, 3 pages.

Torick, E.L. et al. 1968. Automatic Control of Loudness Level. IEEE Transactions on Broadcasting, vol. BC-14, No. 4, Dec. 1968, pp. 143-146.

* cited by examiner

DYNAMIC VOLUME CONTROL AND MULTI-SPATIAL PROCESSING PROTECTION

RELATED APPLICATIONS

This application is related to and claims priority to U.S. Provisional Application No. 61/114,684 filed on 14 Nov. 2008 in the names of Christopher M. Hanna, Gregory Benulis and Scott Skinner; and 61/114,777 filed on 14 Nov. 2008 in the names of Christopher M Hanna and Gregory Benulis, both applications being herein incorporated by reference. This application is also related to copending U.S. application Ser. No. 12/619,653 contemporaneously filed with the present application in the names of Christopher M. Hanna, Gregory Benulis and Scott Skinner; and assigned to the present assignee.

TECHNICAL FIELD

The present application relates to audio signal processing, and more particularly to audio signal volume control and multi-spatial processing protection.

BACKGROUND

During television viewing, volume changes can be irritating and often involve manual volume adjustments by the viewer. One example is the perceived volume change that often occurs when changing channels on a television. Another example would be the perceived volume change that can occur between the broadcast of a television program and a commercial. These large relative changes are typically attributed to lack of level control at the point of broadcast or signal compression introduced during production. A somewhat little known cause of increased perceived loudness is multiple spatial processing. The audio in some program material is processed, in the studio, to introduce surround spatial effects (pseudo-surround) in two-channel systems. If this type of broadcast audio is then processed in the television to introduce two-channel surround effects, as is currently done in many television models, the perceived level change can be dramatic. This additional spatial processing can cause the center image (typically dialogue) to be almost unintelligible. In all cases automatic volume control technology can minimize listener discomfort and maintain a more consistent volume level. While much attention has been paid to leveling the audio volume at the point of broadcast, it seems to have done little to alleviate the problem. In fact, with the advent of high dynamic range DTV broadcasts wider loudness differences can be now perceived by the television viewer.

SUMMARY

In accordance with one aspect of the disclosed system and method, a system is provided for dynamically controlling the perceived volume of a stereo audio program including left and right channel signals, comprising: a dynamic volume control configured and arranged so as to maintain a perceived constant volume level of the stereo audio program; and an excessive spatial processing protection processor configured and arranged for controlling the level of a difference signal created as a function of the right channel signal subtracted from the left channel signal (L–R) relative to the level of a sum signal created as a function of the right channel signal plus the left channel signal; wherein the excessive spatial processing protection processor processes the audio signals so as to control the difference (L–R) signal enhancement.

In accordance with another aspect, a system is provided for dynamically controlling the perceived volume of a stereo audio program including left and right channel signals, comprising: a dynamic volume control configured and arranged so as to maintain a perceived constant volume level of the stereo audio program; and a program change detector configured and arranged to provide a program change signal indicating that the volume of the left and right channel signals has dropped below a threshold level for at least a threshold time period so as to anticipate a possible change in the sound level of the left and right channel signals; wherein the dynamic volume control is responsive to the program change signal.

In accordance with yet another aspect, a system is provided for dynamically controlling the perceived volume of a stereo audio program including left and right channel signals, comprising: a dynamic volume control configured and arranged so as to maintain a perceived constant volume level of the stereo audio program, the dynamic volume control including at least compressor responsive to high and low attack and release ratio thresholds so as define quiet, normal and loud perceived volume levels.

In accordance with still another aspect, a system is provided for dynamically controlling the perceived volume of a stereo audio program including left and right channel signals, comprising: an excessive spatial processing protection processor configured and arranged for controlling the level of a difference signal created from subtracting the right channel signal from the left channel signal (L–R), and a contour filter for shaping the difference signal.

In accordance with yet another aspect, a system is provided for dynamically controlling the perceived volume of a stereo audio program including left and right channel signals. The system comprises: an excessive spatial processing protection processor configured and arranged for controlling the level of a difference signal created from subtracting the right channel signal from the left channel signal (L–R), and a contour filter for shaping the difference signal.

GENERAL DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 5:
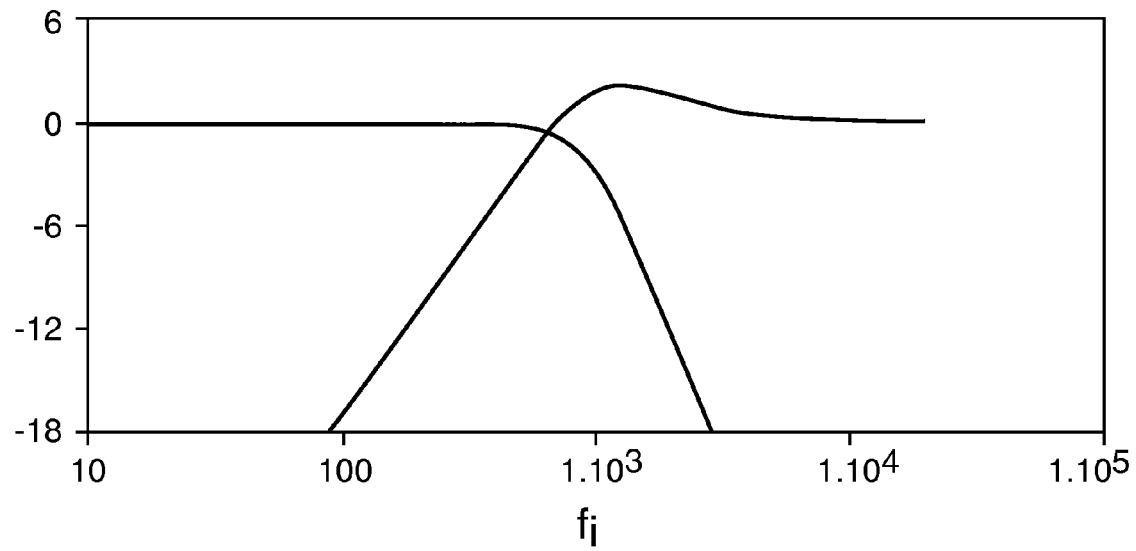
Figure 6:
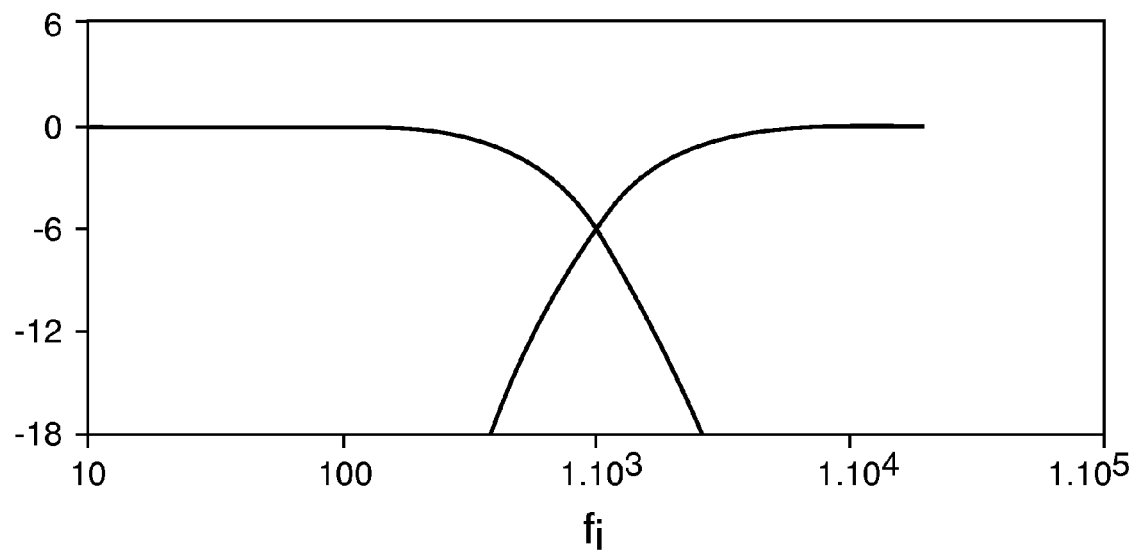
Figure 7:
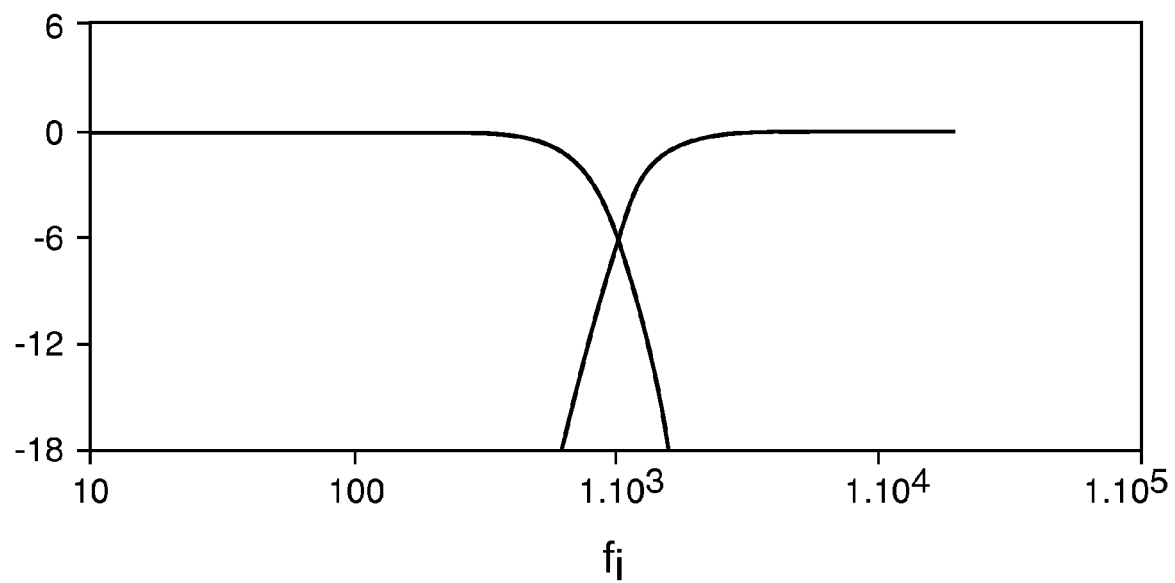
Figure 8:
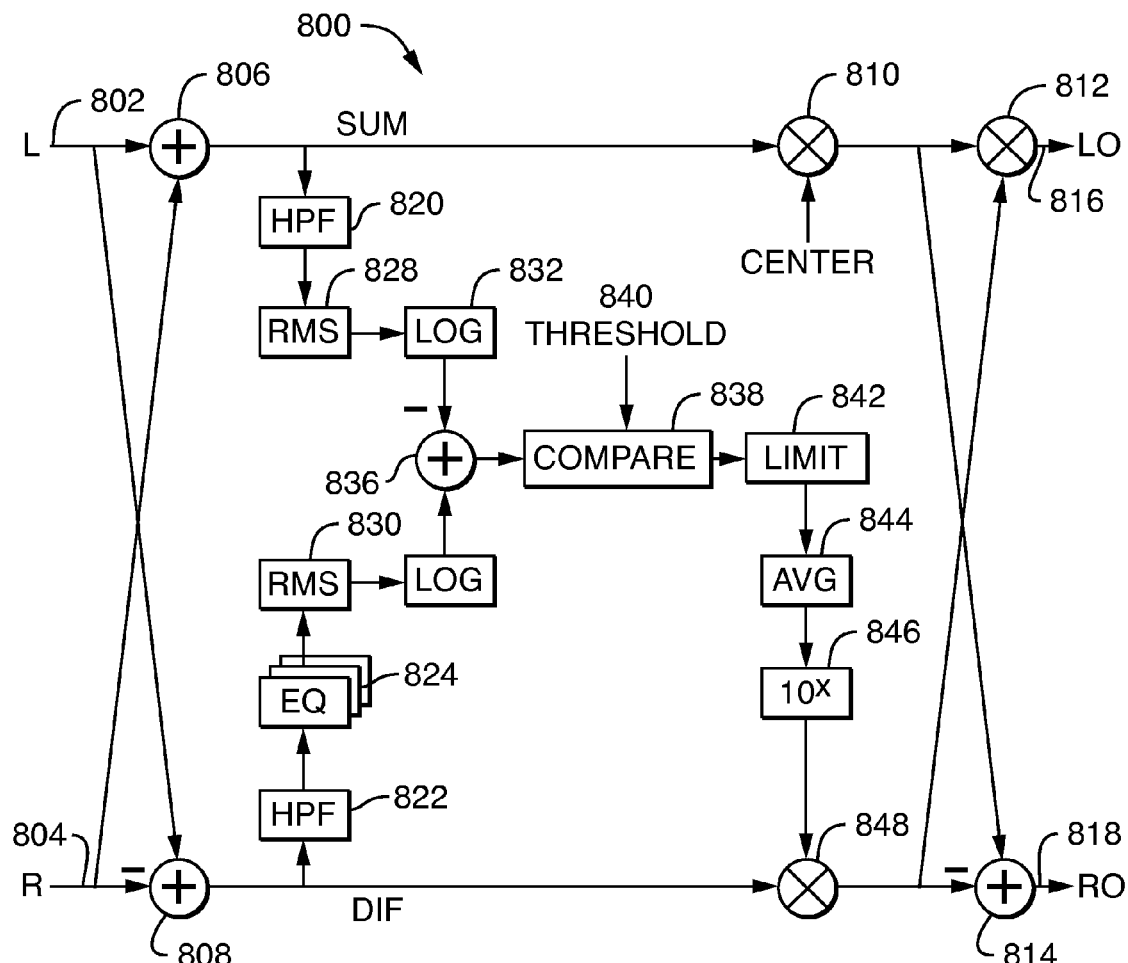
Figure 9:
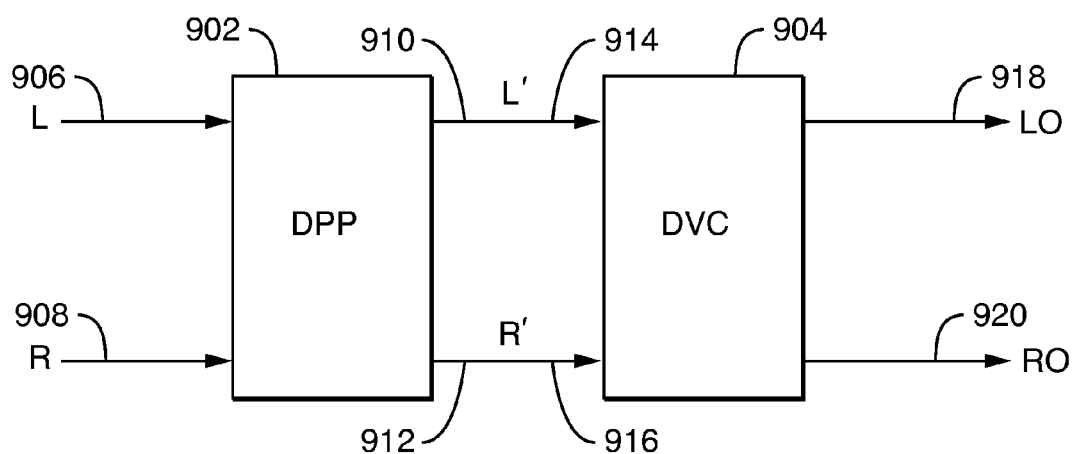
Figure 10:
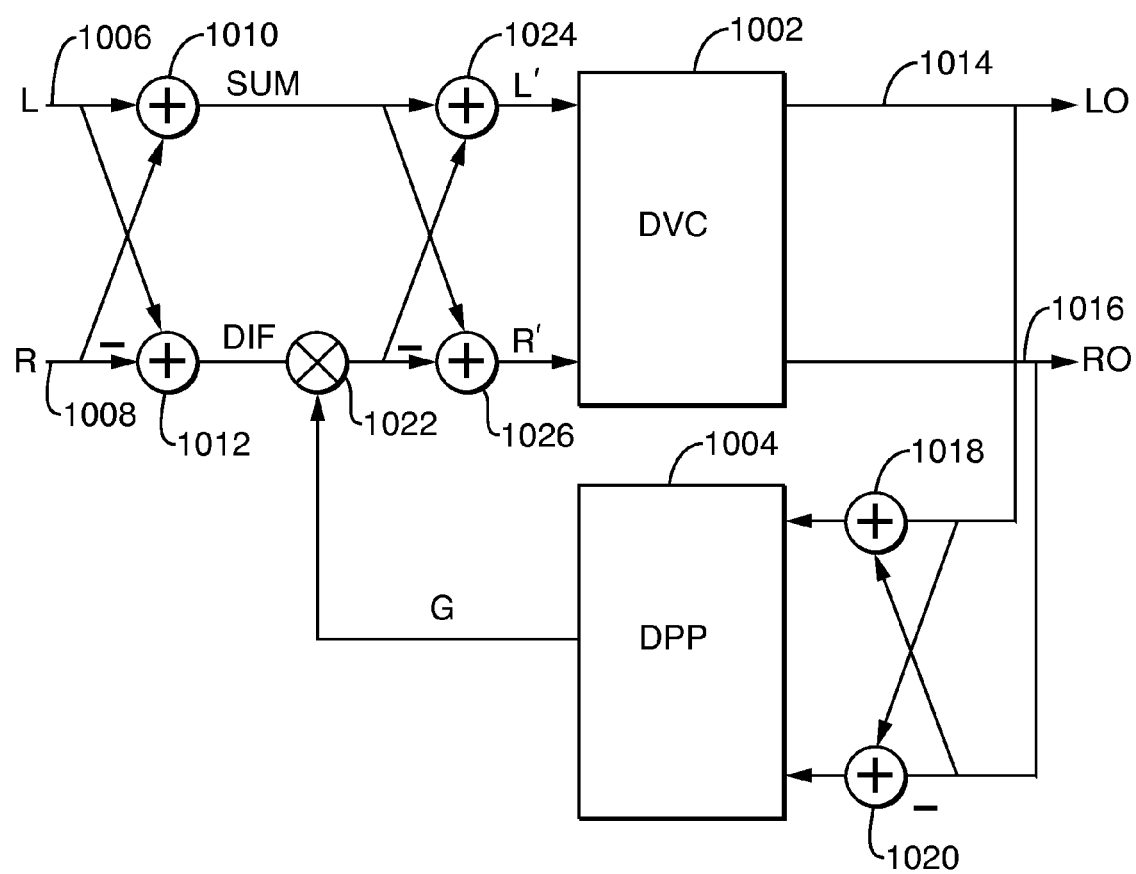

FIGS. 5-7 graphically illustrate frequency responses of a multi-band dynamic volume control system;

FIG. 8 is a simplified block diagram of one embodiment of a double procession protection system;

FIG. 9 is a simplified block diagram of one embodiment of an arrangement of a combined system including both a dynamic volume control system and a double processing protection system; and FIG. 10 is a simplified block diagram of a second embodiment of an arrangement of a combined system including both a dynamic volume control system and a double processing protection system

DETAILED DESCRIPTION OF THE DRAWINGS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Dynamic Volume Control (DVC) System

A DVC system is described for dynamically controlling the volume of an audio signal. The system is configured and arranged so as to dynamically manipulate and modify sound volume when sudden changes occur. The embodiments described herein are configured and arranged so as to maintain a perceived constant volume level for audio band applications. The DVC system can be entirely digital and can be implemented economically in software (C, assembler etc.) or digital hardware (HDL description), although it should be evident that the system can be entirely analog, or a hybrid analog/digital system. Market applications include television audio, DVD player audio, set top box audio, radio audio and other hifi and non-hifi audio products. Without a DVC system of the type described herein, perceived volume levels can vary dramatically as program material changes within a given broadcast/source or as the audio broadcast/source changes. These volume changes can be irritating and often involve manual volume adjustments by the listener. One specific example would be the volume changes that occur when changing channels on a television. Another example would be the volume changes between a television program and a television commercial. In both examples the DVC system would eliminate listener discomfort and maintain a more consistent volume level.

Figure 1:
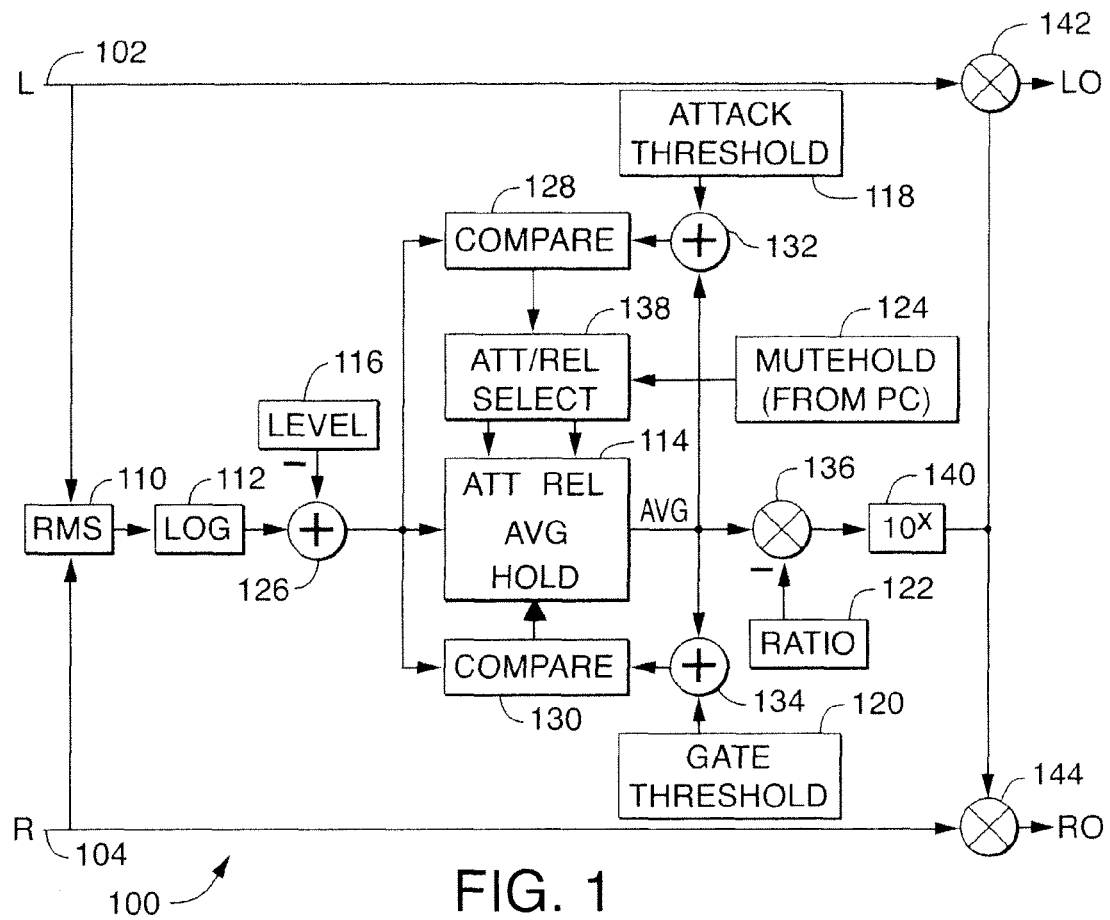
FIG. 1 is a simplified block diagram of one embodiment of a dynamic volume control system.

FIG. 1 shows one embodiment of such a DVC system 100. The system 100 receives two input signals, a left signal L at input 102 and a right signal at input 104. In the embodiments described the DVC system architecture is based upon a digital implementation of a classic compressor design (THAT Corporation Design Note 118) with flexibility and additional modifications that are only possible in a digital implementation. System 100 includes an RMS level detector 110 for providing a signal representative of the sum of the RMS averages of the left and right signals L and R, log conversion block 112, and a signal averaging AVG block 114. Log conversion block 112 converts the output of the RMS level detector 110 from the linear to the logarithmic domain. System 100 is responsive to a number of control signals each indicative of whether a certain condition exists requiring a response from the system The system 100 also includes a host processor (not shown) configured and arranged for carrying out the operating of the DVC system 100. The illustrated embodiment is responsive to a number of control signals including: a target level signal provided by the target signal generating device 116, an attack threshold signal generated by the attack threshold signal device 118, a release threshold (not shown), a gate threshold signal generated by the gate threshold signal device 120, an attack ratio threshold (not shown), a release ratio threshold (not shown), a ratio signal generated by the ratio signal device 122, and a mute hold signal generated by mute hold device 124 responsive to a program change detector (PCD—not shown). Devices 116, 118, 120, 122 can simply be adjustable user controls accessible to the user. Device 124 can be arranged to receive a signal from the TV controls when the channel changes or from a mute detector (not shown) that detects if inputs 102 and 104 have both been muted. The target signal level 116 represents the level in dB, relative to a full scale input, that is the target volume. The attack threshold 118 represents the number of dB that REF must be above AVG before the attack time is reduced by a factor of N, where N can be any number. In one illustrated embodiment N=10. The release threshold signal represents the number of dB that REF must be below AVG before the release time is reduced by a factor of M, where M can be any number, and in one illustrated embodiment M=10 The Gate threshold 120 represents the amount, a negative dB number, that REF can go below AVG before all left and right gain adjustments are frozen. The attack ratio threshold represents the absolute amount, in dB, that REF can go above the target signal level 116 before the volume control begins attenuating the input signal. The release ratio threshold represents the absolute amount, in dB, that REF can go below the target signal level 116 before the volume control begins adding gain to the input signal. The ratio signal 122 adjusts the AVG value by the desired compression ratio.

Target level signal 116 is subtracted from the output of log conversion block 112 by signal summer 126 so as to provide the REF signal to the signal averaging AVG block 114, a comparator 128 and a second comparator 130. The REF signal represents the volume level of the input signal relative to the desired listening threshold. The AVG signal can also be thought of as the instantaneous (prior to attack/release processing) ideal gain recommendation. The output of the signal averaging block 114 is the AVG signal, which is a signal that is a function of the average of the REF signal. The AVG signal is applied to the signal summer 132 where it is added to the attack threshold signal 118. In a similar manner (not shown) the AVG signal is summed with a release threshold. The AVG signal is also applied to the signal summer 134 where it is added to the gate threshold signal 120. The output of signal summer 132 is applied to attack threshold comparator 128 where it is compared to the REF signal, while the output of signal summer 134 is applied to gate threshold comparator 130 where it is compared to the REF signal. The AVG signal is also multiplied by the ratio signal 122 by the signal multiplier 136. The output of comparator 128 is applied to the attack/release selection block 138, which in turn provides either an Att (attack) signal, or a Rel (release) signal to the signal averaging block 114, dependent on and responsive to the status of the mute hold signal 124. The output of the release threshold AVG summer (not shown) is also compared to the REF signal and is applied to the attack/release selection block. The comparator 130 provides an output to the HOLD input of signal averaging block 114. Finally, the signal multiplier 136 provides an output to a log-to-linear signal converter 140, which in turn provides an output which is applied to each of the signal multipliers 142 and 144, wherein it respectively scales the left and right signal provided at the corresponding inputs 102 and 104 so as to provide the output modified left and right signals Lo and Ro.

Referring to FIG. 1, the RMS level detector 110 senses the sound level of the input signal. It should be noted that while an RMS level detector is shown, any type of signal level detector can be used. For example, a peak detector, average detector, perception based level detector (such as the ITU 1770 loudness detector or the CBS loudness detector), or other detector can be used to sense the sound level. These level detectors usually have time constants which are dynamically and independently adjustable. One method of adjusting these time constants is to base them on the envelope or general shape of the input signal so that the time constants vary with the signal. In other embodiments, the time constants are fixed. For ease of data processing, the sound level can be converted into the log domain, as shown, using log conversion block 112. In a multi-band system, a separate RMS detector can be used for each band. The signal averaging block 114 is configured and arranged so as to compute the average of REF relative to the attack and release times. The output signal AVG of the signal averaging block 114 is adjusted by the desired compression ratio, via multiplier 136, to create the gain value to be applied. Finally the gain is converted back into the linear domain by the log-to-linear converter 140 for application to the left and right signals L and R so as to produce the modified left and right signals Lo and Ro.

A target output level represented by the target level signal 116 is subtracted from the sensed level at the output of the log conversion block 112 to determine the difference between the actual and desired sound level. This difference, which represents the level of the input signal relative to the target level signal 116, is known as the reference (REF) signal. The target level signal can be a user input, such as a simple knob or other pre-set setting, so as to control the level of sound desired. This threshold can be fixed or it can be changed as a function of the input signal level to better position the compression relative to the input dynamic range. Once REF signal is obtained, it is provided as an input to the averaging block 114, attack threshold comparator 128 and gate threshold comparator 130. The output of attack threshold comparator 128 is applied to the attack/release select block 138, which in turn receives a signal a MuteHold signals 124 from a program change detector.

The gate threshold signal 120 when added to the current average AVG represents the lowest value REF is able to achieve before left and right gain adjustment (142 and 144) are frozen. The gate threshold comparator 130 receives the instantaneous signal level (REF) signal and determines if the sound level represented by REF drops below the given aforementioned threshold. If the instantaneous signal level (REF) is more than the amount of the gate threshold below the averaged signal level (AVG) appearing at the output of block 114, the gain applied to the signal in the signal path is held constant until the signal level rises above the threshold. The intent is to keep the system 100 from applying increased gain to very low level input signals such as noise. In an infinite hold system, the gain can be constant forever until the signal level rises. In a leaky hold system, the gain can be increased at a gradual pace (much slower than the release time). In a one embodiment, this gate hold threshold is adjustable, while in another embodiment the threshold set by gate threshold 134 is fixed.

The program change detector, or mute-hold, senses when the input is "silent." When a user changes a television (TV) channel, the sound level between the two channels can change, either increasing or decreasing significantly. Typically, a television manufacturer will mute the audio briefly while changing channels to protect the viewer from irritating audio transients. The program change detector is designed to check for this sort of muting by determining if the sound level drops below a predetermined threshold (MuteLev) for a predetermined amount of time (MuteTime). If the instantaneous sound level (REF) is below the threshold for a certain period of time, or "mute time," then a program change is detected. If a program change is detected the speeds of the attack and release times (described in further detail below) are increased. With this increase, if a loud channel is changed to a quiet channel, then the increased release time permits a faster gain increase to meet the target sound output level. Conversely, if a quiet channel is changed to a loud channel, then the increased attack time permits a faster gain decrease to meet the target. If the sound level rises above the threshold before the "mute time" expires, then a program change is not detected. In alternative embodiments, the "mute time" and the mute threshold can be fixed, user adjustable, variable, or otherwise.

Figure 2:
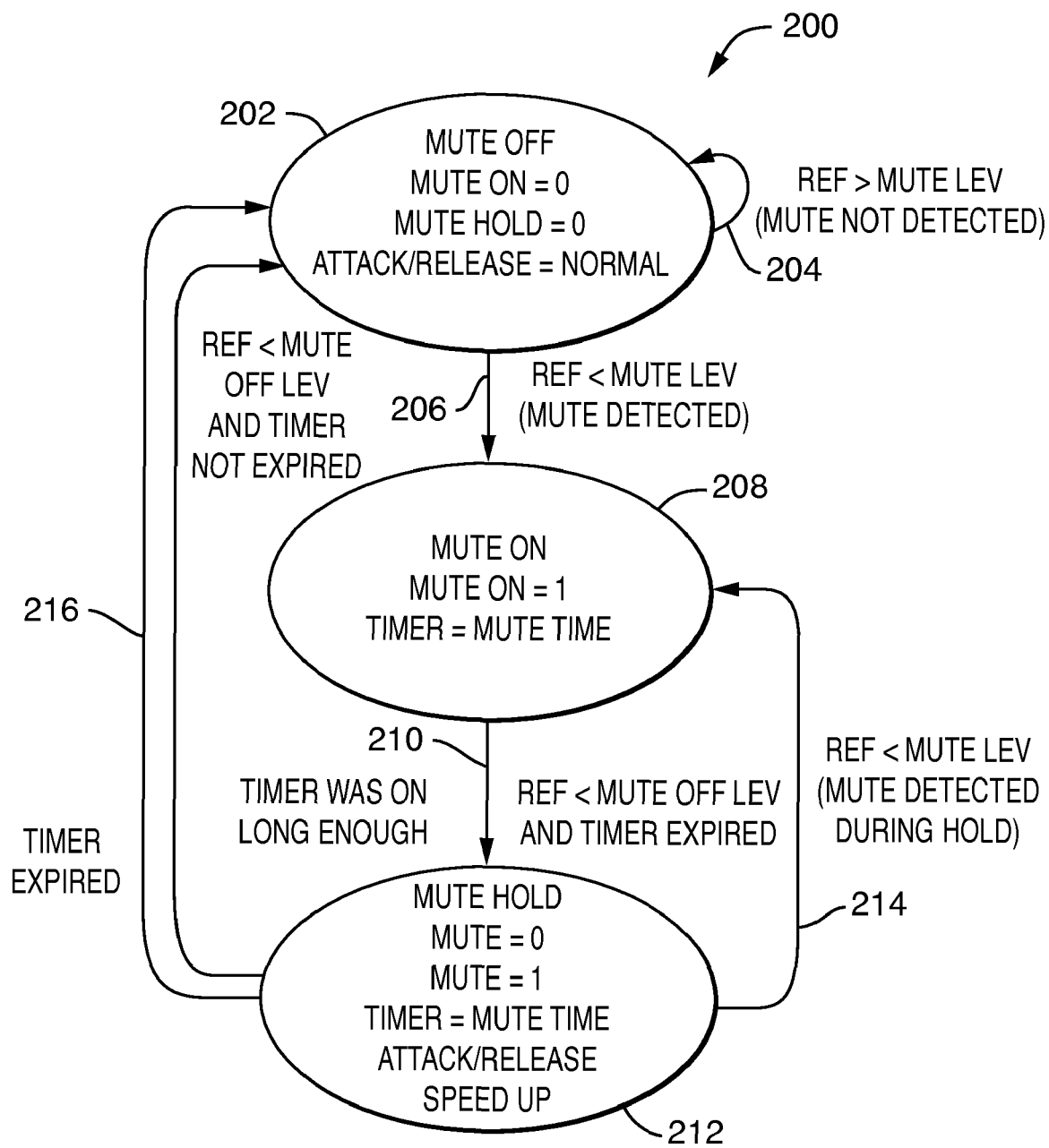
FIG. 2 is a state diagram illustrating one embodiment of the operation of one program change detection.

FIG. 2, illustrates one embodiment of state diagram of a mute detection algorithm for the operation of the program change detector. The operation 200 includes three states, the MUTE OFF state 202, the MUTE ON state 208 and the MUTE HOLD state 212. In the MUTE OFF state 202 the REF signal at the output of the signal summer 126 is periodically compared to MuteLev threshold level at 204 to determine whether REF>MuteLev or REF<MuteLev. If REF>MuteLev, then the operation remains in state 202 and continues in that state. In this state, MUTE ON=0, MUTE HOLD=0, and the attack and release times are at their normal settings. If, however, Ref<MuteLev, a mute is detected and the operation transitions at 206 to state 208 MUTE ON. Once transitioned to state 208, MUTE ON=1, and in the state 208, the program change detector next determines whether the mute condition remains for a predetermined time. If the condition of Mute does not last long enough and REF>MuteOffLev occurs before the expiration of the timer, the detector transitions back to the state 202. This might occur where there is a pause in program where the audio portion is silent. However, where the timer determines that the Mute Time has been expired, a program change has occurred. In this state when the REF>MuteOffLev returns, the detector will transition at 210 to the MUTE HOLD state 212. In this state, the attack and release times are sped up so that a relative loud signal is made softer, and a relatively soft signal is made louder for a predetermined time limit (Mute Time). In FIG. 2 the timer setting in state 208 is shown to be the same as in state 212. It should be obvious that they can also be different values. While in state 212, if the Ref decreases below the MuteLev setting (i.e., Ref<MuteLev) prior to the expiration of the Mute Time, the state transitions at 214 back to state 208. If, however, the Mute Time does expire the detector will transition at 216 back to the state 202.

In one implementation the MuteTime and MuteLev (mute level) are adjustable. The mute time and mute level can also be fixed in a given implementation. The mute threshold is set lower than the gate threshold. The mute detection algorithm can function in an automatic or manual mode. In automatic mode the system 100 detects the mute condition during a channel change. The program change detector can also operate in a manual mode, where a "muting" signal is received from a television or other device indicating that a channel is being changed. Further, the program change detector can also receive signals from a user's remote control to interpret whether the user is changing a channel. The system 100 can also operate using attack and release thresholds. If, in a given time window, a sound level jumps to the extent that the attack threshold 118 is traversed, then the system 100 can operate in "fast attack" mode. In one embodiment, if REF exceeds AVG by the attack threshold, this fast attack mode increases the attack time constant to quickly reduce the gain of this increased sound level. Similarly, if the release threshold is traversed, then the system operates in fast release mode, where the gain is increased quickly. These attack and release time constants can be independently adjustable between each other and also between high and low bands in a multi-band system.

In some implementations the maximum gain applied to the input signal may be limited. This would limit the amount of gain applied to a quiet audio passage. If a loud passage (thunder in a movie) immediately followed the quiet audio passage, unlimited gain could result in significant audio overshoot before the gain could be reduced over the attack time.

Averaging block 114 receives the REF, attack, release and hold signals and determines the average (AVG) of the REF signal based on and as a function of the attack, release, and hold signals. The AVG signal is then adjusted by the compression ratio to be applied to the original signal for volume control. The AVG signal represents the REF signal processed with the Attack/Release time constants. Once a change in REF ripples through the averaging block 114 to affect the AVG signal, it first needs to be adjusted by the desired compression ratio. It should be appreciated that system 100 does not compress infinitely. Once the value of the AVG signal is adjusted by the compression ratio, the AVG signal is multiplied by −(1-ratio) via ratio setting device 122 and multiplier 136. Thus, by way of example, a 4:1 compression ratio would multiply the AVG signal by −(1¼) or −¾. So if the audio is 20 dB above the threshold value, the AVG signal would equal 20 dB (after the attack time constant has elapsed). Multiplying 20 dB by −¾ yields a value of −15 dB. As a result the audio that is 20 dB over the threshold is attenuated to 5 dB after the −15 dB gain is applied. 20/5=4 which is a 4:1 compression ratio.

The compression ratio applied to the signal can be a single sloped ratio. For example, a 4:1 ratio can be applied to the incoming signal, depending on the level threshold. If AVG is above the threshold, then the signal would be reduced by a factor of four (at the attack rate). Conversely, if AVG is below the threshold, then the signal would be amplified by a factor of four (at the release rate).

In another embodiment, the compression ratio can be different, depending on whether the AVG signal is above or below the Target Level threshold provided by device 116. For example, if the AVG signal is above the Target Level threshold, then the signal can be reduced by a factor of four, as in the previous example. In contrast, however, if AVG is below the threshold, then a different ratio can be applied to amplify the input signal, say a 1.5:1 ratio. This arrangement permits the compression of loud signals above the ratio threshold, but also preserves the sound level for quiet dialogue, such as whispers. The arrangement described above could be thought of as a movie mode; it takes the jarring edge off of loud sounds but allows the quiet sounds (leaves rustling etc.) to maintain their original level. This is a good mode for loud volume settings. Thus, a fuller dynamic range can be achieved while still compressing loud annoying signals. Another arrangement involves heavy compression (for example 10:1) for AVG values above and below the Level threshold. Heavy compression is referred to herein as a "night mode" since you can hear all sounds in the program (both loud and soft) without having to turn the volume up (for soft sounds) and down (for loud sounds). Night mode is good for low volume settings, which are often preferred by television viewers during the late night hours.

Even further, another embodiment contemplates the use of high and low attack and release ratio thresholds. In such an embodiment, the two thresholds define three regions of a loudness space: quiet, normal, and loud. In each of these windows, a different compression ratio can be applied. For example, a 1.5:1 ratio can be used to amplify quiet signals, a 1:1 ratio can be used to preserve normal signals, and a 4:1 ratio can be used to attenuate loud signals. With this multi-windowed system, the original dynamic range can more accurately be preserved while fringe loud and soft signals can be attenuated and amplified respectively.

Lastly, if the processing is performed in the log domain, then the calculated compression ratio is "linearized" at 140 before applying the gain to the input signal.

Figure 3:
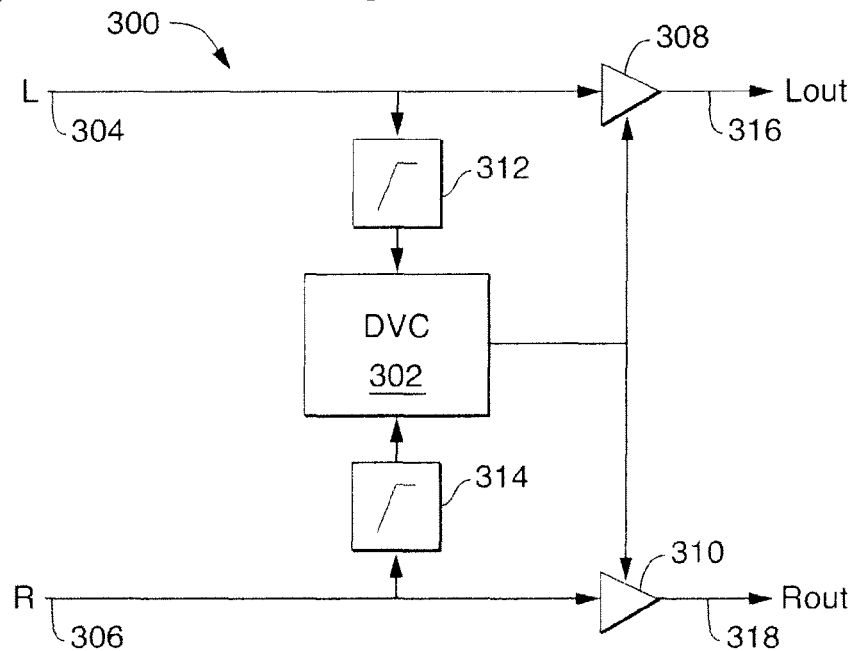
FIG. 3 is a simplified block diagram of one embodiment of a single band of a dynamic volume control system.

FIG. 3 shows a single band system 300 wherein one DVC system 302 can apply the same gain to each of the left (L) and right (R) signals applied to the respective inputs 304 and 306. Specifically, as seen in FIG. 3, the output of the DVC system 302 (provided by the log-to-linear signal converter 140) dynamically sets the gain of each of the amplifiers 308 and 310 respectively, which in turn amplify the corresponding left and rights signals applied to the two inputs of the system 300 providing the Lout and Rout signal at the outputs 316 and 318. The DVC system 302 can be responsive to the entire frequency range of each of the L and R signals, or only a selective band of each as shown in FIG. 3 for example, high pass filters 312 and 314 each only pass a high frequency portion of the respective L and R signals to the DVC system 302, so that the latter only responds to high frequency content of each of the signals.

Figure 4:
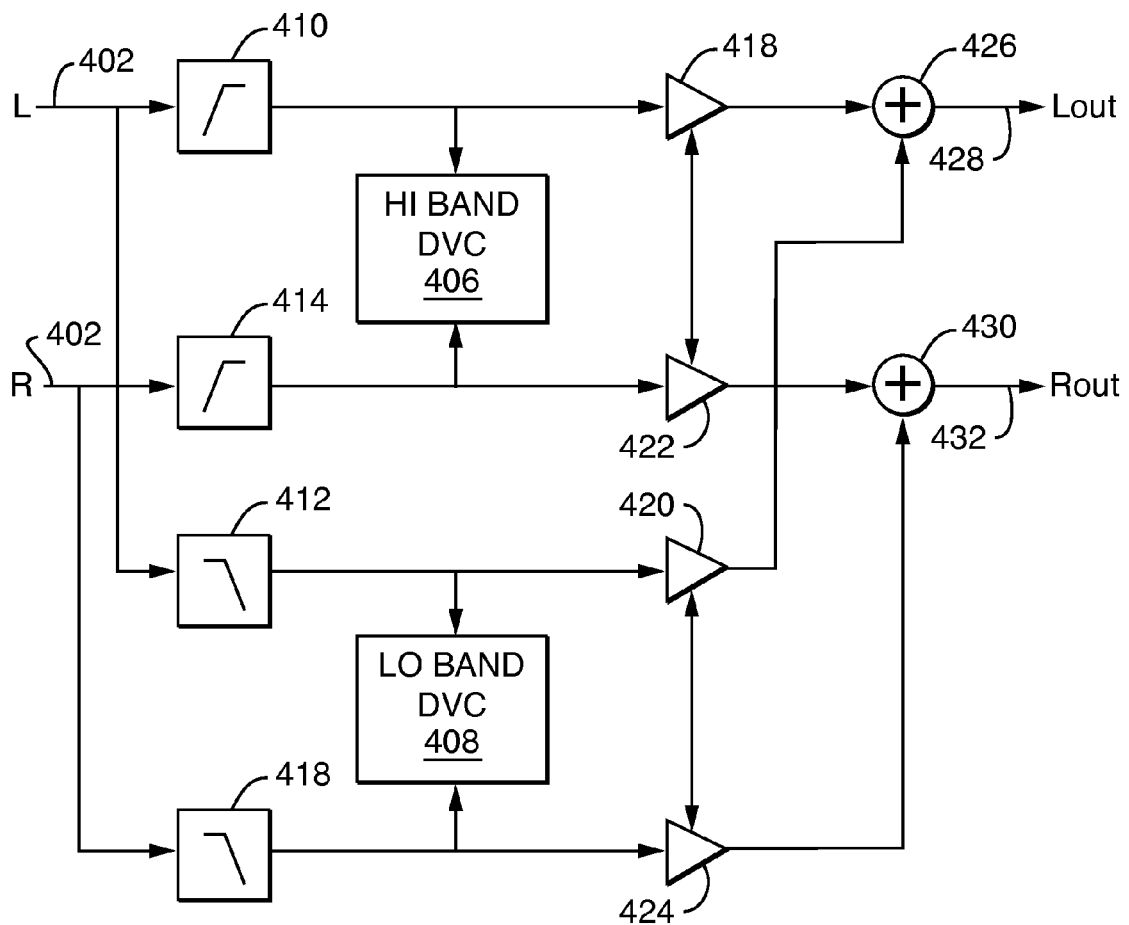
FIG. 4 is a simplified block diagram of one embodiment of a multi-band dynamic volume control system.

Alternatively, a multi-band system can be configured so that select bands are each individually processed by its own DVC system so the L and R signals are independently controlled. As shown in FIG. 4, for example, a two band system 400 employs two DVC systems 406 and 408, each for the L and R signals, so that that L and R signals applied to the inputs 402 and 404 enjoy independent gain control. As shown, the L signal is applied to a high pass filter 410 and low pass filter 412, while the R signal is applied to the high pass filter 414 and low pass filter 416. In a two band system of FIG. 4 with high and low bands, a DVC system (406 and 408) can apply a gain to the L and R signals in the high band by applying the output of each DVC system to the respective outputs of the high and low pass filters. Specifically, the output of DVC system 406 is applied to control the gain of each of the amplifiers 418 and 420 which receive and amplify the high frequency outputs of high pass filters 410 and 412. Similarly, the output of DVC system 408 is applied to control the gain of each of the amplifiers 422 and 424 which receive and amplify the low frequency outputs of the low pass filters 412 and 416. The outputs of amplifiers 418 and 420 are added at signal summer 426 so as to produce the output signal Lout at output 428, while the outputs of amplifiers 422 and 424 are added by the signal summer 430 so as to produce the output signal Rout at output 432.

In another embodiment, if independent gain control of each L and R signal in a multi-band signal is desired, then a separate DVC system can be used for each band of each of the L and R signals. Further, instead of a multi-band system, a high pass filter can be used to eliminate low frequencies for systems unresponsive to low frequencies such as shown in FIG. 3.

Regarding the filters used with the multi-band DVC system, the cross over frequency between each contiguous band (in the two band system this would be the low and high pass bands) can be adjustable. It is also possible to leave the cross over frequency fixed. One example is a crossover based upon a digital implementation of a derived filter. Derived filters are described in THAT Corporation Application Note 104 from THAT Corporation of Milford, Mass., and in Bohn, D. (Ed.), *Audio Handbook* (National Semiconductor Corporation, Santa Clara, Calif. 1976) §5.2.4. In one example of a derived filter implementation, the crossover uses a $2^{nd}$ order Butterworth LPF and a derived HPF which sum to unity as shown in FIG. 5. In another example, the crossover is a traditional digital 2nd order with a Q=0.5 with the HPF inverted so the bands sum to unity as shown in FIG. 6. In yet another example, the crossover is based on 4th order Linkwitz-Riley filters which sum to unity as shown in FIG. 7. In the single band volume control a high pass filter controls the input of the RMS detector.

Multi-Spatial Processing Protection (MPP)

Television manufacturers often include virtual surround (pseudosurround) technology (e.g., SRS Tru-Surround, Spatializer etc.) in the two-channel television audio output path. This two-channel television audio may go to speakers external to the television or to speakers mounted in the television enclosure. These virtual surround technologies create the illusion of surround sound by manipulating and enhancing the difference channel (L−R) present in stereo broadcasts. The listener still perceives an intact center image (L+R) but also often hears the difference channel (L−R) either widened over a broad soundstage or as a point source located somewhere other than the speaker locations. Often this type of spatial enhancement is done during the production of the audio programming. This is especially true of television commercials which are enhanced to grab the listener's attention. When an audio program has two cascaded stages of spatial enhancement (for example at the point of production and in a television's audio processing) there can be significant degradation in the audio quality. The preprocessed audio tends to have significant L−R energy relative to L+R energy. The second, cascaded stage, of spatial enhancement processing tends to increase the amount of L−R energy even more. Recent studies have shown that excessive amounts of L−R enhancement is one of the top factors in listener fatigue. There also can be a significant volume increase.

Accordingly, in accordance with one aspect of the invention, a MPP system is provided. In one embodiment the MPP is a double processing protection (DPP) system that is a part of a television audio signal reception and playback system, prior to the television's stereo enhancement technology. The MPP system is hereinafter referred to as a pseudosurround signal processor. The exemplary DPP system processes the audio signals so as to minimize the difference (L−R) enhancement (i.e., minimizing the energy level of the difference (L−R) signal relative to the sum (L+R) signal) introduced at the point of production. This allows the television's spatial enhancement technology to process the audio signals in a manner that is psychoacoustically pleasing to the listener. The cascade of the DPP system before the television's spatial enhancement audio processing has proven to be quite effective in mitigating the harsh effects of double spatial processing. In one embodiment the DPP system is entirely digital and can be implemented economically in software (C, assembler etc.) or digital hardware (HDL description). It should be appreciated that the DPP system can also be all analog, or a hybrid of analog and digital components.

In one embodiment the DPP system reduces L−R enhancement relative to the corresponding L+R level. The embodiment reduces the effects of multiple 2 channel spatial effects processing. One embodiment of such a system is shown in FIG. 8 at 800. The left signal L and the right signal R are respectively applied to the inputs 802 and 804 of system 800. The L and R signals are applied to matrices represented by the two signal summers 806 and 808. Signal summers 806 and 808 constitute the matrix which provides the SUM (L+R) and DIF (L−R) signals.

In the sum (L+R) path, the signal is generally untouched. The SUM signal usually contains audio content which does not necessarily need to be localized. However, in alternate embodiments, frequency contour shaping can be performed to enhance audio content such as dialogue. As shown, the SUM signal is multiplied by a Center constant at signal multiplier 810 prior to be provided to matrices illustrated as signal summers 812 and 814. The Center constant allows the level of the center image (L+R) to be adjusted, if desired, to aid in intelligibility of dialogue. Adding the L+R and L−R signals provides the left output signal Lo at output 816, while subtracting the L−R from the L+R provides the right output signal Ro at output 818.

In the illustrated embodiment of FIG. 8, most of the processing occurs in the DIF path. L+R and L−R are compared to determine the level of the L−R signal relative to L+R. Before comparison, these two SUM and DIF signals can be each passed through a respective high pass filter 820 and 822, such as in circumstances where the speaker frequency response does not include low frequencies. The L−R DIF signal can further be passed through a multi-band equalizer 824 to accentuate the ear's most sensitive frequencies, namely midrange frequencies, to compensate for the perceived loudness level of the L−R signal. Equalizer 824 allows the difference channel level detection to be frequency dependent. For example, low frequency signals may be minimized when processing for inexpensive television speakers with limited bass response. High frequencies may be minimized to limit the response to transient audio events. Typically mid range frequencies, were the ear is most sensitive, are equalized to dominate the difference level detection. Once the levels of the difference and sum signals are calculated the DIF/SUM ratio is determined.

Each of these signals is then run through a respective signal level detector 828 and 830. The detectors listed above can be used, such as an RMS level detector, although any type of level detector (such as the ones described above) can be used. Also, the processing can all be performed in the log domain to increase efficiency by processing them through the log domain processing blocks 832 and 834.

The outputs of the blocks 832 and 834 are applied to the signal summer wherein the processed SUM signal is subtracted from the processed DIF signal. Subtracting one signal from the other in the log domain is the same as providing a signal that is the ratio of the process SUM signal to that of the DIF signal in the linear domain. Once the L+R and L−R signal levels are calculated, where the L−R signal level may have been equalized prior to level detection to increase the midrange frequencies, these two signal levels are compared by the comparator 838 to a preset threshold 840. The ratio between the two signals ((L−R)/(L+R)) is compared to a threshold ratio by comparator 838 in order to determine the recommended L−R signal gain adjustment. A limiter stage 842 may be used to limit the amount and direction of gain applied to the L−R signal. The illustrated embodiment limits the gain at 0 dB hence only allowing attenuation of the L−R signal, although in some applications, there may be a desire to amplify the L−R signal. An averaging stage 844 averages, with a relatively long time constant, the output of the limiter stage 842 so as to prevent the DPP system from tracking brief transient audio events. After conversion back to the linear domain by linear domain block 846, the level of the L−R signal is correspondingly adjusted by the signal multiplier 848 to achieve that target ratio.

Even in the absence of multiple stages of spatial preprocessing the target (L−R)/(L+R) ratio can be set low to allow, for example, an increased intelligibility of program dialogue.

Another method and system for double processing protection is to "predict" the preprocessing performed on the L−R signal and compensate for the preprocessing from the prediction. For example, if SRS Tru-Surround is known to be used on L−R, then the signal can correspondingly be compensated to remove the L−R enhancement. Alternatively, the signal energy can be monitored over time to deduce the pre-processing performed on the L−R signal. From this deduction, the L−R signal can be compensated to remove any such L−R enhancements. Preprocessing could change the frequency response of the difference (and sum for that matter) channel as well as the L−R/L+R ratio. The inverse filter, of the preprocessor, could be applied to each path while the existing L−R/L+R ratio adjustment still remains in use.

Further, while the DPP system of FIG. 8 is shown as a feed forward system wherein the DIF signal is sensed prior to the variable gain control amplifier 848, a feedback system, wherein the sum and difference signal levels are detected after the variable gain control amplifier is also possible.

Combining DVC and DPP

Since each of the DVC and MPP provide an improved listening experience, the two can be combined to combine the advantages of both. There are a number of ways of combining DVC and DPP blocks. One example of a useful topology places the DPP block 902 first, followed by a DVC block 904 in a cascaded design, as shown in FIG. 9. In this embodiment, the L and R signals are applied to the inputs 906 and 908 of the DPP block 902. The L' and R' outputs of the DDP block 902 at outputs 910 and 912 are applied to the two inputs 914 and 916 of the DVC block 904. The outputs 918 and 920 of DVC block provide the respective output signals Lo and Ro. The cascaded design allows the DPP block to remove the difference (L−R) signal enhancement first, then maintain the perceived constant level of the stereo audio program with the DVC block without ambient energy being present.

Another example of a topology places the DPP block 1004 in a feedback path of the DVC block 1002, as shown in FIG. 10. The L and R inputs are applied to the inputs 1006 and 1008, respectively. The two signals are applied to matrices (represented by signal summers 1010 and 1012) so as to produce the SUM (L+R) signal and the DIF (L−R) signal. The outputs 1014 and 1016 of the DVC block 1002 provide the outputs signals Lo and Ro. The two outputs 1014 and 1016 provide the two feedback signals of the feedback path. Specifically, the Lo and Ro signals are applied to matrices shown as to signal summers 1018 and 1020 so that the Lo+Ro forms one input of the DPP block 1004, and the Lo−Ro forms the other input of the DPP block 1004. The output of the DPP block 1004 represents the corrected gain, which is then applied to the DIF signal by signal multiplier 1022. The latter can be in the form of a variable gain control amplifier. It should be appreciated that while two embodiments of the combined DVC and DPP blocks are illustrated in FIGS. 9 and 10, other combinations are possible.

Accordingly, embodiments of the present disclosure can provide for improved performance of audio signal reproduction which reduces the effects of undesirable volume changes in audio programming.

The components, steps, features, benefits and advantages that have been discussed are merely illustrative. None of them, nor the discussions relating to them, are intended to limit the scope of protection in any way. Numerous other embodiments are also contemplated. Additionally, embodiments of the present disclosure can have fewer, additional, and/or different components, steps, features, benefits and advantages than as expressly described herein. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this disclosure are hereby incorporated herein by reference.

The phrase "means for" if and when used in a claim is intended to and should be interpreted to embrace the corresponding structures and materials that have been described and their equivalents. Similarly, the phrase "step for" if and when used in a claim embraces the corresponding acts that have been described and their equivalents. The absence of these phrases means that the claim is not intended to and should not be interpreted to be limited to any of the corresponding structures, materials, or acts or to their equivalents.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

What we claim is:

1. A system for dynamically controlling the perceived volume of a stereo audio program including left and right channel signals, comprising:
    a dynamic volume control system configured and arranged so as to maintain a perceived constant volume level of the stereo audio program, wherein the dynamic volume control system includes a signal level sensor for sensing the average level of the sum of the left and right channel signal levels; and a signal averaging block configured and arranged for providing an attack time and a release time resulting in signal compression in accordance with a compression ratio, wherein the signal averaging block is further configured so as to compute, and provide as an output signal for a gain value to be applied to the left and right channel signals, an average (AVG) of a reference (REF) signal relative to the attack and release times, wherein the reference (REF) signal represents the volume level of the input signal relative to a desired listening threshold; and
    an excessive spatial processing protection processor configured and arranged for controlling the level of a difference signal, created as a function of the right channel signal subtracted from the left channel signal (L−R), relative to the level of a sum signal, created as a function of the right channel signal plus the left channel signal;
    wherein the excessive spatial processing protection processor processes the audio signals so as to control the difference (L−R) signal relative to the sum (L+R) signal.

2. A system according to claim 1, wherein the excessive spatial processing protection processor is connected in series with the dynamic volume control.

3. A system according to claim 2, wherein the excessive spatial processing protection processor is cascaded in front of the dynamic volume control system so as to control the difference (L−R) signal enhancement relative to the sum (L+R) signal first, then maintaining the perceived constant level of the stereo audio program with the dynamic volume control without an inordinate amount of ambient difference energy being present.

4. A system according to claim 1, wherein the excessive spatial processing protection processor is in a feedback path of the dynamic volume control system.

5. A system according to claim 1, wherein the dynamic volume control system is responsive to one or more of the following:

a target level signal representative of the desired volume level of the sum of the left and right channel levels, wherein a difference signal is representative of the difference between the sensed average level and the target level signal;

an attack threshold signal representative of the number of dB of the difference signal must be above a set point before the attack time is increased by a factor of N;

a release threshold signal representative of the number of dB of the difference signal must be below a set point before the release time is increased by a factor of M;

an attack ratio threshold signal representative of the absolute amount, in dB, that a difference signal can go above a set point before the dynamic volume control begins attenuating the left and right channel signals;

a release ratio threshold signal representative of the absolute amount, in dB, that the difference signal can go below a set point before the dynamic volume control begins adding gain to the left and right channel signals; and a ratio signal for adjusting the sensed average level by a desired compression ratio.

6. A system according to claim 5, wherein N and M are each 10.

7. A method of dynamically controlling the perceived volume of a stereo audio program including left and right channel signals, the method comprising:

dynamically controlling the volume level of a stereo audio program so as to maintain the volume level at a perceived constant volume level, wherein dynamically controlling the volume level includes sensing the average level of the sum of the left and right channel signal levels; and providing an attack time and a release time for signal compression in accordance with a compression ratio, and computing, and providing as an output signal for a gain value to be applied to the left and right channel signals, an average (AVG) of a reference (REF) signal relative to the attack and release times, wherein the reference (REF) signal represents the volume level of the input signal relative to a desired listening threshold; and controlling the level of a difference signal created as a function of the right channel signal subtracted from the left channel signal (L−R), relative to a sum signal created as a function of the right channel signal added to the left channel signal;

wherein controlling includes processing the audio signals so as to control difference (L−R) signal enhancement relative to the sum signal (L+R).

* * * * *